United States Patent
Li

(10) Patent No.: US 10,261,705 B2
(45) Date of Patent: Apr. 16, 2019

(54) EFFICIENT DATA CONSISTENCY VERIFICATION FOR FLASH STORAGE

(71) Applicant: Alibaba Group Holding Limited, George Town (KY)

(72) Inventor: Shu Li, Bothell, WA (US)

(73) Assignee: Alibaba Group Holding Limited (KY)

( * ) Notice: Subject to any disclaimer, the term of this patent is extended or adjusted under 35 U.S.C. 154(b) by 0 days.

(21) Appl. No.: 15/380,069

(22) Filed: Dec. 15, 2016

(65) Prior Publication Data
US 2018/0173438 A1    Jun. 21, 2018

(51) Int. Cl.
G06F 11/00    (2006.01)
G06F 3/06    (2006.01)
G06F 11/10    (2006.01)
G11C 29/52    (2006.01)

(52) U.S. Cl.
CPC .......... G06F 3/0619 (2013.01); G06F 3/0611 (2013.01); G06F 3/0655 (2013.01); G06F 3/0688 (2013.01); G06F 11/1004 (2013.01); G06F 11/1072 (2013.01); G11C 29/52 (2013.01)

(58) Field of Classification Search
None
See application file for complete search history.

(56) References Cited

U.S. PATENT DOCUMENTS

| | | | |
|---|---|---|---|
| 7,076,604 B1 | 7/2006 | Thelin | |
| 7,120,737 B1 | 10/2006 | Thelin | |
| 7,257,714 B1 | 8/2007 | Shen | |
| 8,194,340 B1 | 6/2012 | Boyle | |
| 8,194,341 B1 | 6/2012 | Boyle | |
| 8,612,798 B1 | 12/2013 | Tsai | |
| 9,880,933 B1* | 1/2018 | Gupta | G06F 12/0815 |
| 2004/0044850 A1* | 3/2004 | George | G06F 12/082 711/131 |
| 2004/0133622 A1* | 7/2004 | Clubb | G06F 9/505 709/200 |
| 2010/0199036 A1* | 8/2010 | Siewert | G06F 3/0613 711/112 |
| 2013/0086006 A1* | 4/2013 | Colgrove | G06F 17/30159 707/692 |

(Continued)

OTHER PUBLICATIONS

Wei et al. "Reliably Erasing Data from Flash-Based Solid State Drives." Fast. vol. 11. 2011.

*Primary Examiner* — Daniel F. McMahon
(74) *Attorney, Agent, or Firm* — Van Pelt, Yi & James LLP

(57) ABSTRACT

Data verification includes obtaining a logical block address (LBA), which is associated with a data block of a file, to be verified. Data verification further includes reading, from a solid state drive (SSD) comprising one or more flash storage elements, data content that corresponds to the LBA. Data verification further includes determining whether an access latency associated with the reading of the data content exceeds a threshold. Data verification further includes, in the event that the access latency does not exceed the threshold, evaluating the data content to determine whether it is consistently stored in a physical memory included in the SSD. Data verification further includes, in the event that the data content is determined not to be consistently stored in the physical memory included in the SSD, recording an indication indicating that the LBA is not successfully verified.

23 Claims, 8 Drawing Sheets

(56) References Cited

U.S. PATENT DOCUMENTS

| | | | |
|---|---|---|---|
| 2013/0097380 A1* | 4/2013 | Colgrove | G06F 17/30159 711/118 |
| 2014/0189212 A1* | 7/2014 | Slaight | G06F 12/0866 711/103 |
| 2014/0215129 A1* | 7/2014 | Kuzmin | G06F 12/0246 711/103 |
| 2015/0199138 A1* | 7/2015 | Ramachandran | G06F 12/122 711/103 |
| 2016/0041778 A1* | 2/2016 | Li | G06F 3/061 711/114 |
| 2016/0299805 A1* | 10/2016 | Zhou | G06F 12/0246 |

\* cited by examiner

EFFICIENT DATA CONSISTENCY VERIFICATION FOR FLASH STORAGE

BACKGROUND OF THE INVENTION

Currently, enterprises, data centers, and other large scale networks often employ storage devices implemented using flash drives with high storage density (also referred to as solid state drives (SSDs)). Such networks must support high throughput and high input/output operations per second (IOPS). Given the tremendous amount of data being processed, some data loss is inevitable. For example, the active write process where data is written from the host to the drive and the background write process where garbage collection takes place can lead to data loss on the flash. To guarantee data accuracy and quality, the infrastructure operator typically needs to support real-time data consistency detection.

A conventional technique for data consistency detection is cyclic redundancy check (CRC). To generate a CRC at the file level, all data in a file is considered as a data stream. N zero bits are appended at the end of the user data of the file (N is an integer >0). A suitable polynomial of (N+1) degrees is selected based on the length of the data stream. The data stream is divided by the (N+1)-degree polynomial from the left to the right, resulting in an N-bit remainder (the CRC), which replaces the N zero bits in the user data. The data stream is then written into storage. When the file is read, its data stream is divided by the same (N+1) degree polynomial, and the N-bit remainder is generated at the end. If the remainder is an all-zero sequence, the file is deemed to be correct; otherwise, the file is deemed to contain error.

The CRC technique requires reading all data out then calculating the remainder for a file. Because the CRC process is computationally intensive and occupies large amounts of server processors and memory, it is unsuitable by itself for large scale storage systems. Further, while the CRC technique can detect errors, it does not pinpoint the location of the errors. A more efficient and more accurate data verification technique is needed.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Data consistency verification for flash-based solid state drives (SSDs) using access latency is disclosed. In some embodiments, logical block addresses (LBAs) associated with data blocks of files on a host file system are obtained. Data content that corresponds to the LBAs is read from a solid state drive (SSD). It is determined whether an access latency associated with the reading from the SSD exceeds a threshold. In the event that the access latency exceeds the threshold, a verification result is recorded that indicates that the data content that corresponds to the LBA is consistently stored in physical memory of the SSD. In the event that the access latency does not exceed the threshold, the data content is further evaluated to determine whether it is consistently stored in the physical memory of the SSD to determine the verification result, and the verification result is recorded. The verification result is output so that error reporting and/or error correction can be made.

Figure 1:
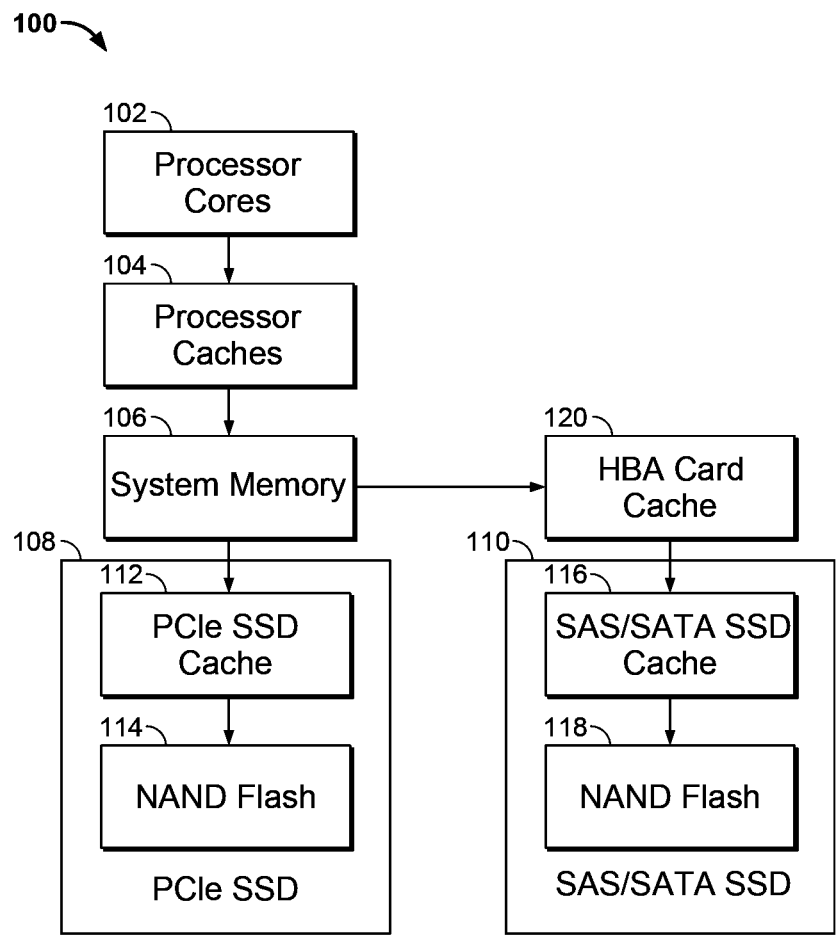
FIG. 1 is a block diagram illustrating a cache hierarchy of an embodiment of a NAND-based flash storage device.

When files are created by applications and written into the SSD, there are multiple levels of caches involved in the writing process. FIG. 1 is a block diagram illustrating a cache hierarchy of an embodiment of a NAND-based flash storage device.

Device 100 includes processor cores 102, processor caches 104, and system memory 106. System memory 106 is configured to, among other things, provide processor cores 102 with computer instructions. Processor caches 104 and system memory 106 can be implemented using random access memory (RAM). In some embodiments, processor caches 104 and system memory 106 can be implemented using static random access memory (SRAM) and dynamic random access memory (DRAM), respectively. Further, device 100 includes two types of SSDs: peripheral component interconnect express (PCIe) SSD 108 and serial attached SCSI/serial AT attachment (SAS/SATA) SSD 110. The SSDs include one or more flash storage elements, such as NAND flash elements 114 and 118. In other embodiments, a single type of SSD or other types of SSDs can be used.

When a processor writes data to the SSD, the data is transferred from system memory 106 into PCIe SSD 108 via a PCIe bus, or to SAS/SATA SSD 110 via a host bus adaptor (HBA) card, which includes an HBA card cache 120. Further, PCIe SSD 108 includes PCIe SSD cache 112, and SAS/SATA SSD 110 includes SAS/SATA SSD cache 116. During normal operation, all levels of caches cooperate to provide fast, temporary data storage and access.

The use of hierarchical caches improves performance but can also lead to data consistency problems. Specifically, a data block corresponding to an LBA used by a host file system is said to be consistent if the corresponding data content of the data block has been successfully written to a physical location in a flash of an SSD. On the other hand, the data block is said to be inconsistent if it is deemed to have been recorded by the host file system, but in fact has not been successfully written into a physical location in a flash of an SSD. Data inconsistency can occur because the data content may have only been written into a volatile cache but not flash storage. Because the caches are volatile, any data stored within the caches but not written to flash will be lost if power is lost. While some SSDs have a power loss protection (PLP) feature, only a part of the internal cache in the SSDs can be guaranteed by PLP. Data inconsistency can also occur during garbage collection, where data is read out from physical memory and written into free areas in a consolidated fashion.

Figure 2:
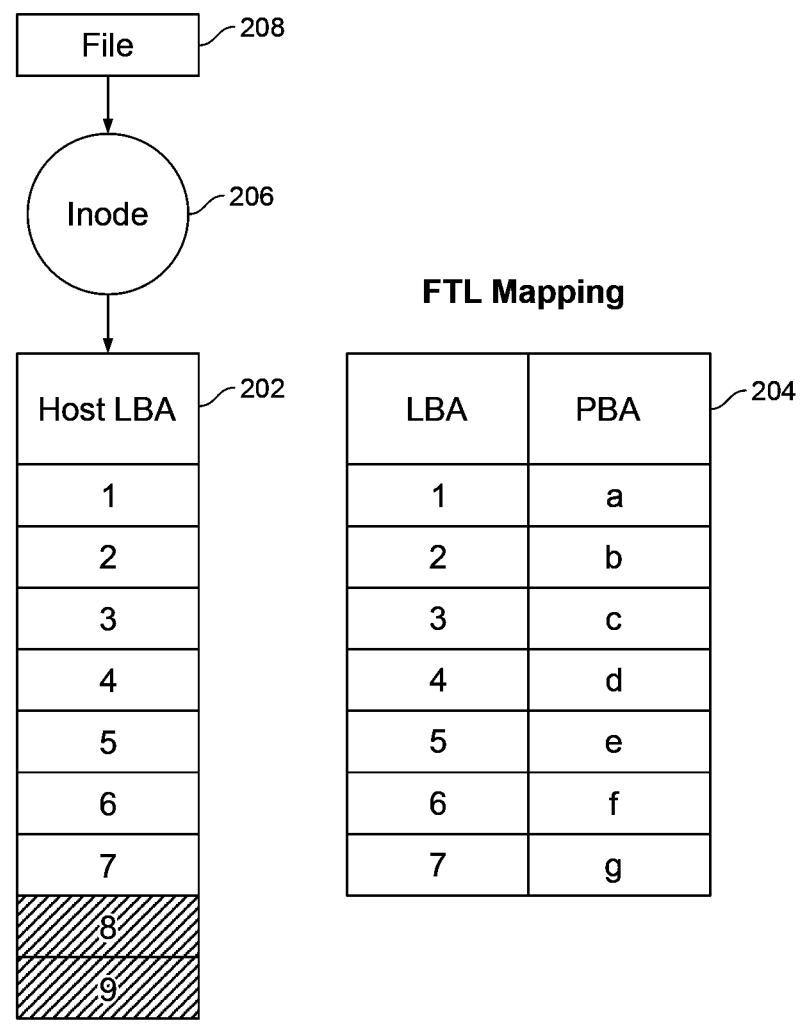
FIG. 2 is a diagram illustrating embodiments of data structures used to map data between the host and the SSD.

FIG. 2 is a diagram illustrating embodiments of data structures used to map data between the host and the SSD. The host system reads and writes data to storage by reading and writing files. When a file 208 is mapped into the memory space of the file system, the file is represented using an inode 206. The memory occupied by the file is partitioned into data blocks, and represented using logical block addresses (LBAs). In other words, the LBAs are used by the host file system to specify the locations of data blocks in system memory. An inode is a data structure used to describe the file. The inode includes various attributes associated with the file, including the LBAs. An inode can be obtained by invoking a library function, a system call, or the like. 202 illustrates a list of host LBAs corresponding to an inode of a file. When a data block corresponding to an LBA is written from the host operating system or file system (e.g., from the processor cache or system memory) to the SSD, the physical memory address on the flash drive that stores the data block is referred to as the physical block address (PBA). Simple values of 1-9 and a-g are used for purposes of illustration and different values can be used in implementation.

The SSD's controller assigns a corresponding physical block address (PBA) when a block of data from an LBA is written to the flash, and maintains the LBA-to-PBA mapping in a flash translation layer (FTL). 204 illustrates an LBA-to-PBA mapping table in an FTL. When data consistency is violated, the host deems certain data to be written to the SSD, but the inconsistent data is in fact only written to the SSD's cache and not written to the flash. Meanwhile, the file system keeps related information such as the data's LBA in the inode. The SSD has not written the LBA to flash and therefore does not have a corresponding LBA-to-PBA mapping in the FTL. In the example shown, LBAs 8 and 9 have no corresponding PBAs in the FTL due to data inconsistencies.

The PBA can be an address in the cache or in the flash. In some embodiments, an additional column in the table is used to indicate whether the data content corresponding to the PBA is in a cache. For example, 1 indicates that the data is stored in the cache, and 0 indicates that the data is not stored in the cache but in the flash. In some embodiments, data stored in the cache and data stored in the flash reside in different physical address ranges and can therefore be distinguished on the basis of the PBA value.

Figure 3:
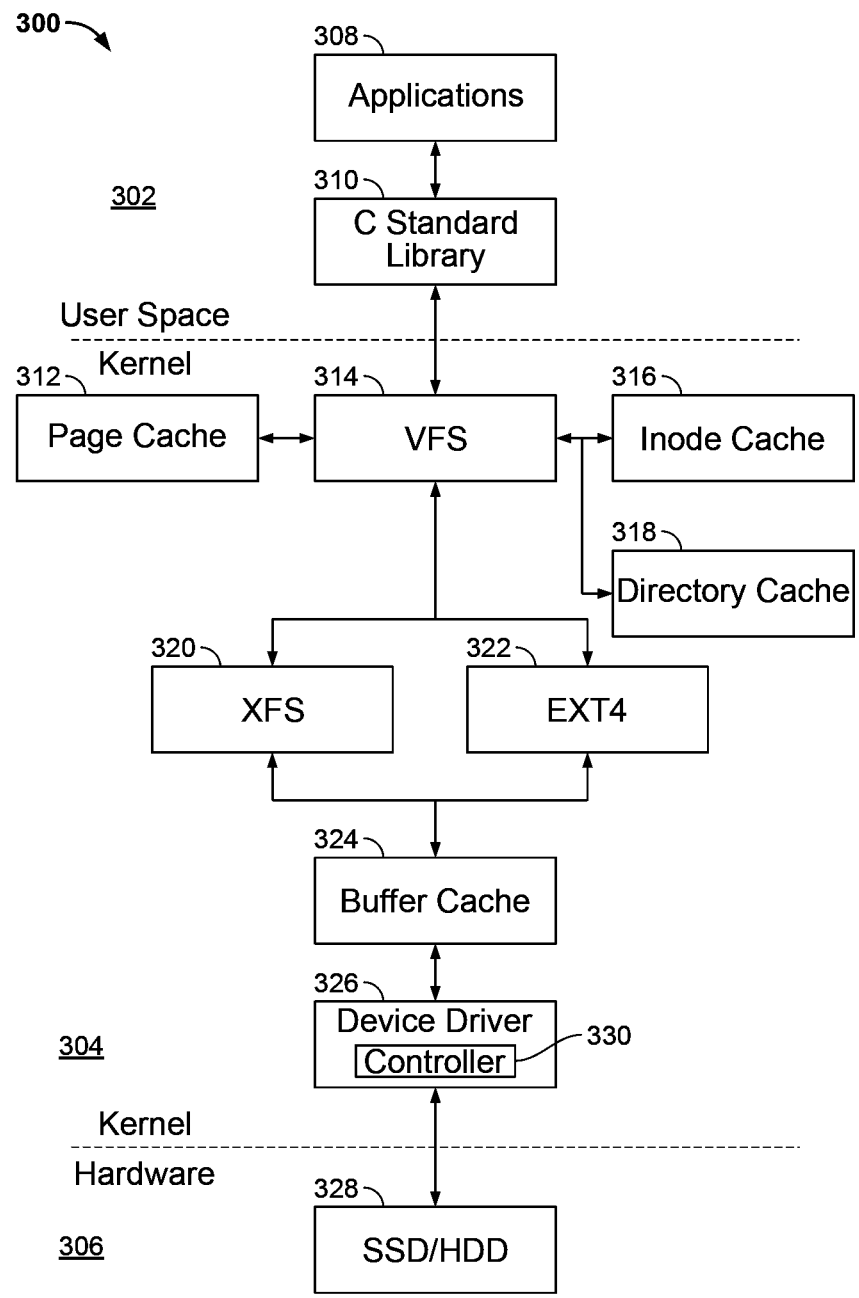
FIG. 3 is a block diagram illustrating an example of an I/O path for an embodiment of a NAND-based storage system.

FIG. 3 is a block diagram illustrating an example of an I/O path for an embodiment of a NAND-based storage system.

Various components described in 300 can be implemented as software components executing on one or more processors, as hardware components such as programmable logic devices (e.g., microprocessors, field-programmable gate arrays (FPGAs), digital signal processors (DSPs), etc.), Application Specific Integrated Circuits (ASICs) designed to perform certain functions, or a combination thereof. In some embodiments, the components can be embodied by a form of software products which can be stored in a non-volatile storage medium (such as optical disk, flash storage device, mobile hard disk, etc.), including a number of instructions for making a computer device (such as personal computers, servers, network equipment, etc.) implement the methods described in the embodiments of the present application. The components may be implemented on a single device or distributed across multiple devices. The functions of the components may be merged into one another or further split into multiple sub-components.

System 300 is divided into three logical spaces: user space 302 that runs applications 308, standard libraries 310, etc.; kernel space 304 that supports various components of the operating system and/or file system, such as page cache 312, inode cache 316, directory cache 318, virtual file system 314, extends file system (XFS) 320, fourth extended file system (EXT4) 322, buffer cache 324, device driver 326, etc.; and hardware space 306 that includes the driver hardware, such as SSDs and/or hard disk drives 328. In the embodiment shown, device driver 326 is a standard device driver modified to include a controller 330 configured to, among other control functions, perform data verification. The FTL is stored in the controller's memory. In other embodiments, controller 330 can be implemented as a separate component between the device driver and the hardware. Controller 330 can be implemented as software, hardware, firmware, and/or a combination. Details of the operations of the controller are described below.

Aside from the controller, the other components shown in system 300 can be standard components. In this example, a Linux®-based system is shown for purposes of illustration; the components and their arrangements can be different in other embodiments. For example, in a system implementing a different operating system such as Windows®, the kernel space includes new technology file system (NTFS)-based components instead of inode, XFS, EXT4, etc.

In system 300, an application in the user space reads or writes blocks of data by manipulating files. Initially, an application calls a certain function (e.g., an open( ) system function or standard library function) to open a file. The file is located by the kernel using a corresponding file descriptor (e.g., inode), which is returned to the application. Thereafter, the application uses the returned file descriptor value (in connection with read or write system calls) to read from or write to the file. As will be described in greater detail below, the controller performs data consistency verification based on response time associated with a read request.

Figure 4:
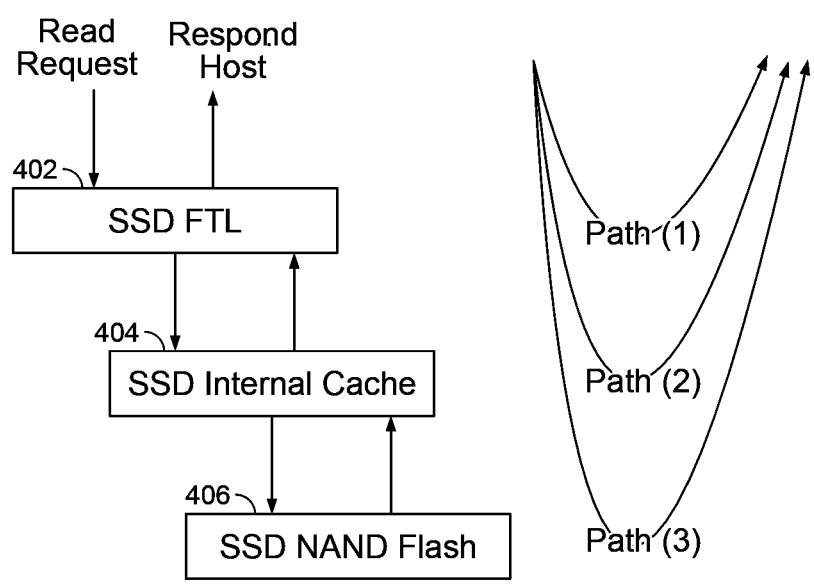
FIG. 4 is a diagram illustrating example response times associated with different data paths.

FIG. 4 is a diagram illustrating example response times associated with different data paths. Paths (1)-(3) represent different access latencies (also referred to as read latencies)

associated with the processing of a read request from the host. As used herein, the access latency corresponds to the time period that begins when the read operation initiates and ends when a result is returned. The access latency can be measured by counting clock cycles associated with the read time.

When a read request is made by the host file system and received by the SSD, FTL 402 checks the LBA-to-PBA mapping. If an LBA associated with the read request is not in the LBA list of the SSD (e.g., LBA 8 or 9 of FIG. 2), the FTA will directly enter the "no mapping" status and send a null (all-zero) block to the host without reading either the cache or the NAND flash. This process corresponds to path (1) in the figure, which has the shortest access latency.

If the LBA is valid in the SSD's LBA list, according to the data verification technique described herein, an attempt is made to load the requested block from internal cache 404 of the SSD. When there is a cache hit, the requested data is loaded from the SSD's internal DRAM or SRAM and sent to the host without further access to the NAND flash. This process corresponds to path (2), which has longer latency than path (1).

When there is a cache miss, the requested data is read out of NAND flash 406. This process corresponds to path (3), which has a longer latency than path (2).

The data verification technique described herein relies on the access latency differences to detect data blocks that may have data inconsistency.

Figure 5:
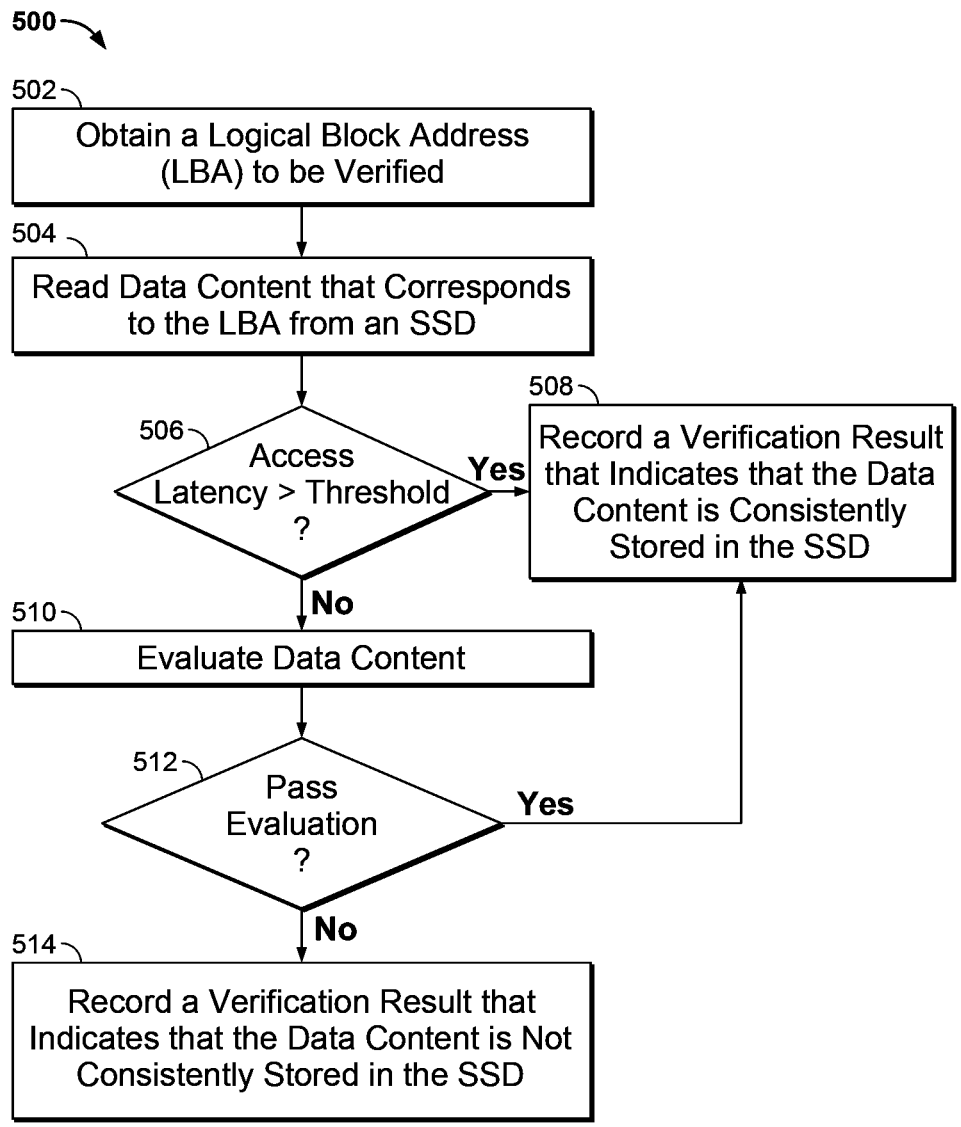
FIG. 5 is a flowchart illustrating an embodiment of a process for verifying data consistency.

FIG. 5 is a flowchart illustrating an embodiment of a process for verifying data consistency. Process 500 can be performed by a controller such as 330 of FIG. 3.

In this example, before the process starts, a file that is being verified is divided into multiple blocks represented using corresponding LBAs. The list of LBAs of a file can be obtained from an inode associated with the file. To verify data consistency, the LBAs can be checked one by one, or multiple LBAs can be selected and checked in parallel to improve efficiency. Process 500 performs verification for a single LBA and its associated data block.

At 502, a logical block address (LBA) to be verified is obtained. In this example, the LBA is selected among the LBAs corresponding to the file that is being verified.

At 504, data content that corresponds to the selected LBA is read from an SSD. To implement the read operation, the FTL looks up the LBA in the LBA-to-PBA mapping to locate a corresponding PBA. If no PBA is found, a null block is sent; if a corresponding PBA is found, the data content corresponding to the PBA is retrieved from the PBA address, which can be in the SSD's cache or flash. Meanwhile, the latency of the read operation is tracked. In this example, the latency is tracked by a timer that resets when the read operation initiates.

As discussed above in connection with FIG. 4, depending on whether the data content is non-existent, stored in the cache, or stored in the flash, the access latencies will differ. Note that although a single line is shown in FIG. 4 for each path for purposes of illustration, the access latencies by different read operations for a given path can vary depending on a number of factors, and therefore each path has a range of access latency times. The distributions of access latencies associated with different paths shown in FIG. 4 can overlap. In other words, the access latency associated with path (1) (no corresponding PBA found for the LBA) can be longer than the access latency associated with path (2) (a corresponding PBA is found and there is a cache hit) in certain instances. To efficiently identify reads that may be related to path (1), a threshold value is selected. The threshold value can be selected empirically based on measurements of read operations following known paths, such that when the access latency exceeds the threshold, it is likely (e.g., 95% probable) that path (2) or path (3) is taken.

Returning to FIG. 5, at 506, it is determined whether the access latency associated with the read operation exceeds the threshold. If the access latency exceeds the threshold, the LBA and its associated data block are deemed to be consistent. In other words, the LBA's corresponding data content is consistently/successfully stored in a physical memory included in the SSD. A verification result that indicates that the data content is consistently stored in the SSD's physical memory (or equivalently, the verification of the LBA is successful) is recorded, at 508.

If, however, the latency does not exceed the threshold, it is possible that path (1) or path (2) is taken, and the data block is deemed to be suspicious. Accordingly, at 510, the suspicious data content is further evaluated to determine whether the data content is consistently stored in a physical memory in the SSD. In this example, a set of criteria is checked during the evaluation.

Figure 8:
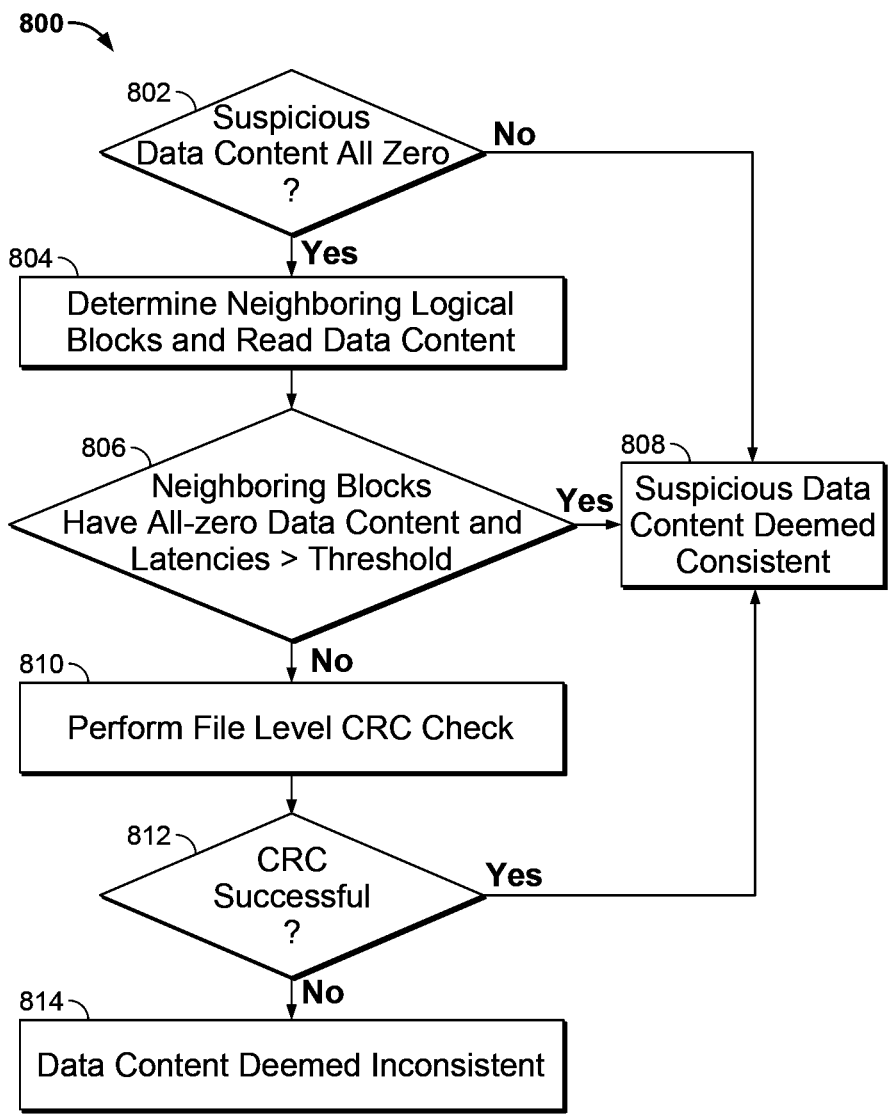
FIG. 8 is a flowchart illustrating an embodiment of a process for evaluating suspicious data content.

FIG. 8 is a flowchart illustrating an embodiment of a process for evaluating suspicious data content. Process 800 can be used to implement 510 of process 500. At 802, it is determined whether the suspicious data content is all zero. If the suspicious data content is not all zero, then the data block likely experienced a fast read out of the cache (path (2)) and is deemed to be consistent at 808. If the data content is all zero, one or more neighboring LBAs (e.g., the LBA immediately before the LBA under verification and/or the LBA immediately after the LBA under evaluation) are determined, and their corresponding data content is read, at 804. These neighboring LBAs can be identified using the LBA list (e.g., 202 of FIG. 2) and the corresponding data content can be determined by using the FTL's mapping table (e.g., 204).

If the one or more neighboring LBAs are found to have all-zero data content and their respective access latencies exceed the threshold, at 806, then the stored data content corresponding to the neighboring LBAs as well as the suspicious data content under reevaluation are likely to be all-zero, and therefore are deemed to be consistent, at 808. Otherwise, a file-level CRC check is performed at 810. Note that the file data in this case includes file-level CRC encoding, and the CRC check can be performed using known techniques. If the file-level CRC check is successful, at 812, the suspicious data content is deemed to be consistent, at 808; otherwise, the suspicious data content is deemed to be inconsistent, at 814.

Returning to FIG. 5, at 512, it is determined whether the data content passes the evaluation (in other words, whether the suspicious data content is consistent). If no, a verification result that indicates that the data content is not consistently stored in the SSD's physical memory is recorded. If yes, a verification result that indicates that the data content is consistently stored in the SSD's physical memory (or equivalently, the verification of the LBA is successful) is recorded. In some embodiments, 508 is omitted and only verification results indicating inconsistency are recorded. In some embodiments, process 500 is a part of a process for verifying an entire file, and the verification result indicating that the specific data block is inconsistent is recorded and/or output for later use. The record can include the LBA, the PBA, the file name, location of the inconsistent data, etc.

In some embodiments, the verification result is output. For example, the verification result can be output to a reporting software module that generates a report for a system administrator user based on the verification. As another example, the verification result is output to an error correction software module. In response to a verification result indicating that the data block is inconsistent, error correction is optionally performed using known error correction techniques. For instance, in systems that support data backups, a mirrored copy of the data block can be retrieved from a backup storage location (e.g., a replica system) and stored to the flash drive. As another example, forward error correction coding such as erasure coding is applied to the original data, making it possible to recover the original data when a subset of the data is corrupt.

Figure 6:
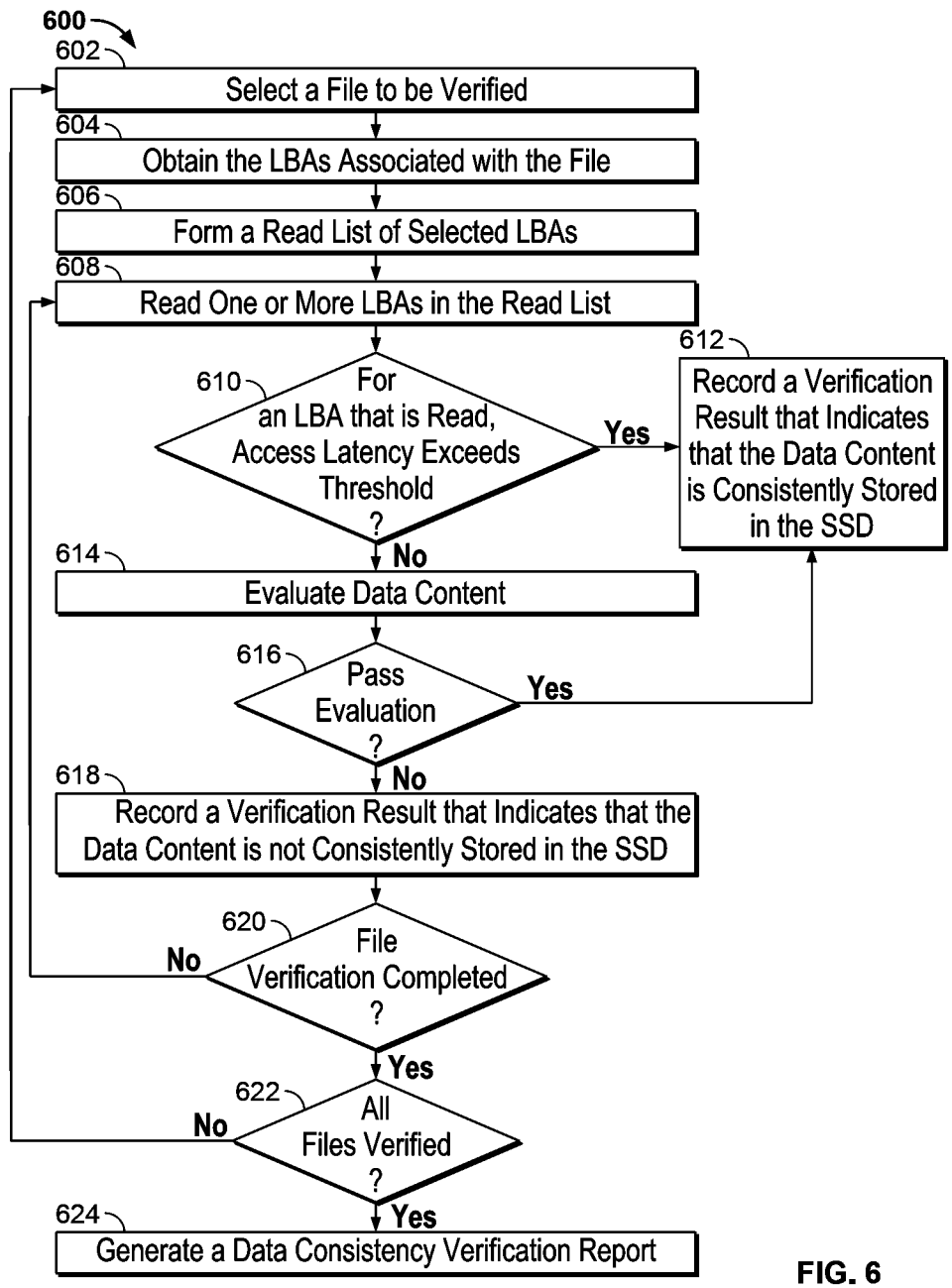
FIG. 6 is a flowchart illustrating another embodiment of a process for verifying data consistency.

FIG. 6 is a flowchart illustrating another embodiment of a process for verifying data consistency. Process 600 can be performed by a controller, and is configured to verify data consistency for files associated with a host file system.

Initially, the host file system provides a list of files that should be verified. At 602, a file that has not been verified is selected. The selection can be done sequentially or in any other appropriate order.

At 604, the LBAs associated with the selected file are obtained. In this case, the LBAs are obtained by accessing the inode associated with the selected file and retrieving the LBAs associated with the inode using an operating system call.

At 606, a read list of selected LBAs is formed.

Figure 7:
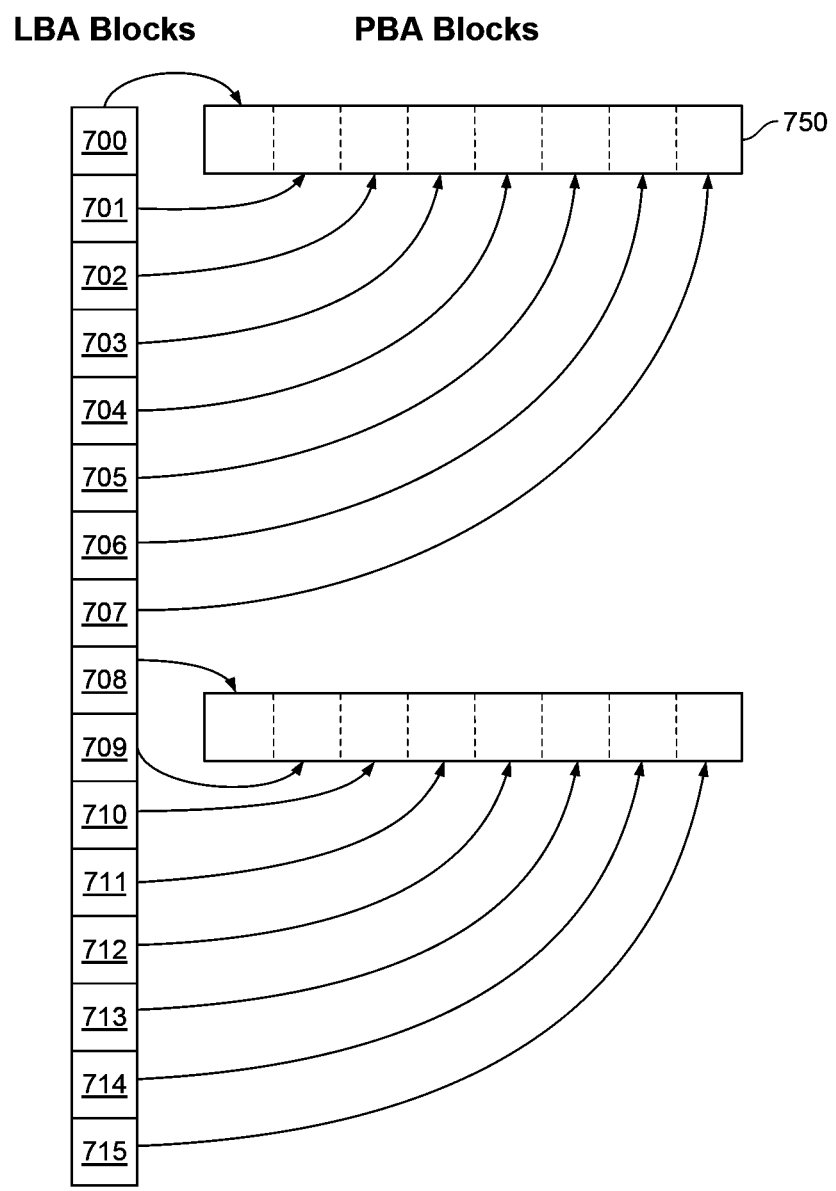
FIG. 7 is a data diagram illustrating an example of host file system LBA blocks and corresponding SSD PBA blocks.

While all the LBAs can be verified individually, it is more efficient to verify only a subset of the LBAs. FIG. 7 is a data diagram illustrating an example of host file system LBA blocks and corresponding SSD PBA blocks. As shown, the host file system and the SSD use different block sizes. In this example, a conventional host file system such as ext4 employs LBAs of 512-byte blocks such as 700-707, while the SSD's PBA uses 4-kilobyte blocks such as 750. The portions on the PBA block that correspond to the host file's LBA blocks are indicated using arrows. In the example shown, eight host file system LBA blocks correspond to one SSD PBA block. Because the SSD's write operation is performed at the block level, a PBA block will either be successfully written or not, and data consistency of the PBA block needs to be guaranteed on a per-block basis. In other words, if a single host file system LBA block (e.g., any of blocks 700-707) has a corresponding PBA block portion that is deemed to be inconsistent, then the entire PBA block (e.g., block 750) is deemed to be inconsistent. Accordingly, only one out of the eight host file system LBA blocks that correspond to the same PBA block needs to be checked to determine whether all eight LBA blocks have consistent data. In this case, one out of eight host file LBA blocks corresponding to the same PBA can be selected randomly or according to a selection sequence to form the read list, such that the selected LBAs in the read list correspond to different physical data blocks.

Returning to FIG. 6, at 608, one or more LBAs in the LBA blocks are read in a random order, in parallel, and the respective access latencies are measured. For instance, assume that the LBAs on the file system are numbered sequentially, and the LBAs in the read list are blocks 702 (selected among blocks 700-707), 711 (selected among blocks 708-715), 720 (selected among blocks 716-723), and 726 (selected among blocks 724-731). These blocks will not necessarily be read sequentially in the order of 702, 711, 720, and 726. Rather, they may be read in the order of 720, 711, 726, and 702 or in some other arbitrary order. The random ordering of the blocks for reading avoids the file system's read-ahead feature that predicts which blocks will be read in the future and preloads the data into caches before the read operation occurs. Multiple reads can be performed in parallel; for instance, blocks 702, 711, 720, and 726 can be verified in parallel simultaneously; or blocks 702 and 726 are verified together, while blocks 711 and 720 are verified together.

610-618, which verify each LBA in the read list, are similar to 506-514 of process 500. At 620, it is determined whether the verification for the file has been completed, or equivalently, whether all the LBAs in the read list have been verified. If not, control is returned to 608 to read more LBAs and measure their access latencies. If yes, control proceeds to 622 to determine whether all files have been verified. If no, control returns to 602 to select another unverified file. If yes, control proceeds to 624 where a data consistency verification report is generated and output for the user. Alerts and messages can be generated in the event that there are too many errors. Optionally, inconsistent data blocks are corrected using techniques such as reading data from backup, repairing data using error correction code, or any other appropriate error correcting techniques.

Data consistency verification for storage devices including flash storage has been disclosed. Using access latency to verify data consistency results in high scan speed, low host resource consumption, and reasonable location accuracy.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A method, comprising:
    obtaining a logical block address (LBA), the LBA being associated with a data block of a file;
    reading, from a solid state drive (SSD), data content that corresponds to the LBA, wherein the SSD includes one or more flash storage elements and one or more caches, and wherein the one or more flash storage elements and the one or more caches have different access latencies;
    determining whether an access latency associated with the reading of the data content exceeds a threshold;
    in response to a determination that the access latency does not exceed the threshold, evaluating the data content to determine whether it is consistently stored in a physical memory included in the SSD; and
    in response to a determination that the data content is determined not to be consistently stored in the physical memory included in the SSD, recording an indication indicating that the LBA is not successfully verified.

2. The method of claim 1, wherein the LBA is among a plurality of LBAs associated with a plurality of data blocks of the file.

3. The method of claim 1, wherein:
    the LBA is among a plurality of LBAs associated with a plurality of data blocks of the file; and
    the method further comprises:
        obtaining the plurality of LBAs from an inode associated with the file; and
        selecting a subset of the plurality of LBAs to form a read list.

4. The method of claim 1, wherein:
    the LBA is among a plurality of LBAs associated with a plurality of data blocks of the file; and
    the method further comprises:
        obtaining the plurality of LBAs from an inode associated with the file; and selecting a subset of the plurality of LBAs to form a read list, wherein the selected subset of the plurality of LBAs corresponds to different physical data blocks.

5. The method of claim 1, wherein:
the evaluating of the data content to determine whether it is consistently stored in the physical memory included in the SSD includes determining whether the data content is all-zero; and
in response to a determination that the data content is determined not to be all-zero, the data content is deemed to be consistently stored in the physical memory.

6. The method of claim 1, wherein:
the evaluating of the data content to determine whether it is consistently stored in the physical memory included in the SSD includes determining whether the data content is all-zero;
in response to a determination that the data content is determined not to be all-zero, the data content is deemed to be consistently stored in the physical memory; and
in response to a determination that the data content is determined to be all-zero, the evaluating of the data content to determine whether it is consistently stored in the physical memory included in the SSD includes:
determining one or more neighboring LBAs;
determining whether the one or more neighboring LBAs have all-zero data content and access latencies greater than the threshold; and wherein
in response to a determination that the one or more neighboring LBAs have all-zero data content and access latencies greater than the threshold, the data content is deemed to be consistently stored in the physical memory included in the SSD.

7. The method of claim 1, wherein:
the evaluating of the data content to determine whether it is consistently stored in the physical memory included in the SSD includes determining whether the data content is all-zero;
in response to a determination that the data content is determined not to be all-zero, the data content is deemed to be consistently stored in the physical memory; and
in response to a determination that the data content is determined to be all-zero, the evaluating of the data content to determine whether it is consistently stored in the physical memory included in the SSD further includes:
determining one or more neighboring LBAs;
determining whether the one or more neighboring LBAs have all-zero data content and access latencies greater than the threshold; and
in response to a determination that the one or more neighboring LBAs do not have all-zero data content, the access latencies are not greater than the threshold, or both, performing a file-level cyclic redundancy code (CRC) check.

8. The method of claim 1, wherein the LBA is deemed to be successfully verified in in response to a determination that the access latency exceeds the threshold.

9. The method of claim 1, wherein in response to a determination that the data content is found not to be consistently stored in the physical memory included in the SSD, the method further comprises performing an error correction.

10. A system, comprising:
one or more processors configured to:
obtain a logical block address (LBA), the LBA being associated with a data block of a file;
read, from a solid state drive (SSD), data content that corresponds to the LBA, wherein the SSD includes one or more flash storage elements and one or more caches, and wherein the one or more flash storage elements and the one or more caches have different access latencies;
determine whether an access latency associated with the reading of the data content exceeds a threshold;
in response to a determination that the access latency does not exceed the threshold, evaluate the data content to determine whether it is consistently stored in a physical memory included in the SSD; and
in response to a determination that the data content is determined not to be consistently stored in the physical memory included in the SSD, record an indication indicating that the LBA is not successfully verified; and
one or more memories coupled to the one or more processors and configured to provide the one or more processors with instructions.

11. The system of claim 10, wherein the LBA is among a plurality of LBAs associated with a plurality of data blocks of the file.

12. The system of claim 10, wherein:
the LBA is among a plurality of LBAs associated with a plurality of data blocks of the file; and
the one or more processors are further configured to:
obtain the plurality of LBAs from an inode associated with the file; and
select a subset of the plurality of LBAs to form a read list.

13. The system of claim 10, wherein:
the LBA is among a plurality of LBAs associated with a plurality of data blocks of the file; and
the one or more processors are further configured to:
obtain the plurality of LBAs from an inode associated with the file; and
select a subset of the plurality of LBAs to form a read list, wherein the selected subset of the plurality of LBAs corresponds to different physical data blocks.

14. The system of claim 10, wherein:
to evaluate the data content to determine whether it is consistently stored in the physical memory included in the SSD includes to determine whether the data content is all-zero; and
in response to a determination that the data content is determined not to be all-zero, the data content is deemed to be consistently stored in the physical memory.

15. The system of claim 10, wherein:
to evaluate the data content to determine whether it is consistently stored in the physical memory included in the SSD includes to determine whether the data content is all-zero;
in response to a determination that the data content is determined not to be all-zero, the data content is deemed to be consistently stored in the physical memory; and
in response to a determination that the data content is determined to be all-zero, to evaluate the data content to determine whether it is consistently stored in the physical memory included in the SSD includes to:
determine one or more neighboring LBAs;

determine whether the one or more neighboring LBAs have all-zero data content and access latencies greater than the threshold; and wherein in response to a determination that the one or more neighboring LBAs have all-zero data content and access latencies greater than the threshold, the data content is deemed to be consistently stored in the physical memory included in the SSD.

16. The system of claim 10, wherein:

to evaluate the data content to determine whether it is consistently stored in the physical memory included in the SSD includes to determine whether the data content is all-zero;

in response to a determination that the data content is determined not to be all-zero, the data content is deemed to be consistently stored in the physical memory; and in response to a determination that the data content is determined to be all-zero, to evaluate the data content to determine whether it is consistently stored in the physical memory included in the SSD includes to:

determine one or more neighboring LBAs;

determine whether the one or more neighboring LBAs have all-zero data content and access latencies greater than the threshold; and in response to a determination that the one or more neighboring LBAs do not have all-zero data content, the access latencies are not greater than the threshold, or both, perform a file-level cyclic redundancy code (CRC) check.

17. The system of claim 10, wherein the LBA is deemed to be successfully verified in in response to a determination that the access latency exceeds the threshold.

18. The system of claim 10, wherein in response to a determination that the data content is found not to be consistently stored in the physical memory included in the SSD, the system further comprises performing an error correction.

19. The system of claim 10, wherein the one or more flash storage elements include a NAND flash.

20. A non-transitory computer program product for data verification, the non-transitory computer program product being embodied in a tangible computer readable storage medium and comprising computer instructions for:

obtaining a logical block address (LBA), the LBA being associated with a data block of a file;

reading, from a solid state drive (SSD), data content that corresponds to the LBA, wherein the SSD includes one or more flash storage elements and one or more caches, and wherein the one or more flash storage elements and the one or more caches have different latencies;

determining whether an access latency associated with the reading of the data content exceeds a threshold;

in response to a determination that the access latency does not exceed the threshold, evaluating the data content to determine whether it is consistently stored in a physical memory included in the SSD; and in response to a determination that the data content is determined not to be consistently stored in the physical memory included in the SSD, recording an indication indicating that the LBA is not successfully verified.

21. A method, comprising:

obtaining a logical block address (LBA), the LBA being associated with a data block of a file;

reading, from a solid state drive (SSD), data content that corresponds to the LBA, wherein the SSD includes one or more flash storage elements and one or more caches, and wherein the one or more flash storage elements and the one or more caches have different access latencies;

determining whether an access latency associated with the reading of the data content exceeds a threshold;

in response to the access latency exceeding the threshold, recording an indication indicating that the LBA is successfully verified.

22. The method of claim 1, wherein the indication includes a location of the data content.

23. The system of claim 10, wherein the indication includes a location of the data content.

* * * * *